United States Patent [19]

Bertotti et al.

[11] Patent Number: 4,614,962

[45] Date of Patent: Sep. 30, 1986

[54] CONTROLLED ELECTRONIC SWITCHING DEVICE FOR THE SUPPRESSION OF TRANSIENTS

[75] Inventors: Franco Bertotti, Milan; Paolo Ferrari, Gallarate; Mario Foroni, Valeggio Sul Mincio; Sergio Garue, Peschiera Borromeo, all of Italy

[73] Assignee: SGS-ATES Componenti Elettronici S.p.A., Catania, Italy

[21] Appl. No.: 677,763

[22] Filed: Dec. 3, 1984

[30] Foreign Application Priority Data

Dec. 15, 1983 [IT] Italy .................. 24197 A/83

[51] Int. Cl.⁴ ............. H01L 29/74; H01L 27/02; H03K 17/60
[52] U.S. Cl. ......................... 357/38; 357/86; 357/51; 307/252 K
[58] Field of Search .......... 357/38, 38 R, 86, 51; 307/252 K

[56] References Cited

U.S. PATENT DOCUMENTS 4,223,332  9/1980  Sittig ..................... 357/86

FOREIGN PATENT DOCUMENTS 0046578  8/1981  European Pat. Off. ......... 357/38 A

Primary Examiner—Andrew J. James
Assistant Examiner—R. P. Limanek
Attorney, Agent, or Firm—Guido Modiano; Albert Josif

[57] ABSTRACT

This controlled electronic switching device for the suppression of transients can change over from a nonconductive state to a conductive state at lower triggering current levels than conventional devices while retaining unaltered its response characteristics to variations in the voltage applied thereacross. The device comprises a main switch which is triggered by a parallel-connected auxiliary switch having smaller junction areas and a higher capacitive current shunt resistance (resistance between base and emitter) than the main switch, thereby it turns on at lower control currents from the gate electrode for a given response to voltage variations.

2 Claims, 7 Drawing Figures

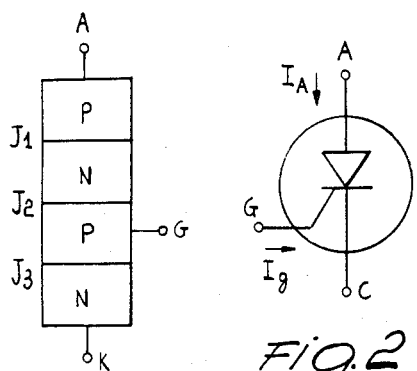
Fig.1
PRIOR ART
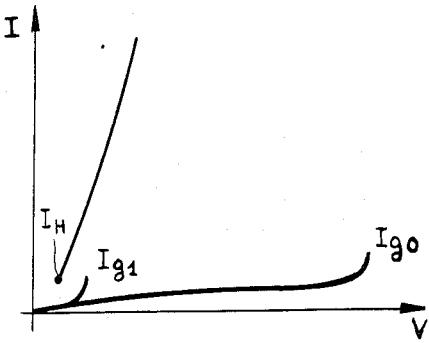
Fig.2
PRIOR ART
Fig.3
PRIOR ART
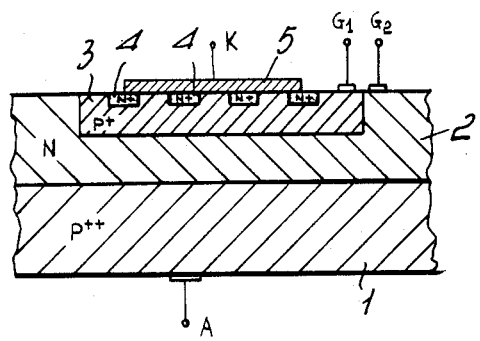
Fig.4
PRIOR ART
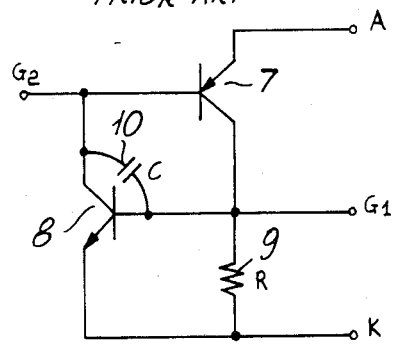
Fig.5
PRIOR ART
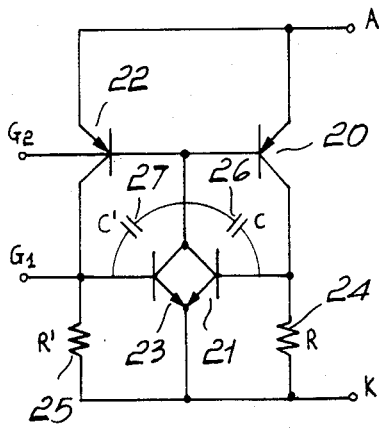
Fig.6
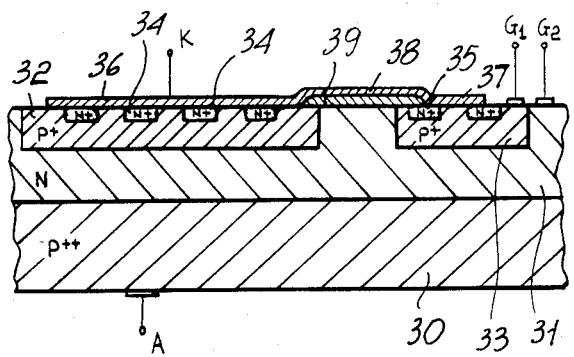
Fig.7

CONTROLLED ELECTRONIC SWITCHING DEVICE FOR THE SUPPRESSION OF TRANSIENTS

BACKGROUND OF THE INVENTION

This invention relates to a controlled electronic switching device for the suppression of transients, which can change over between two different (on and off) states according to the state of an externally applied control signal.

Such devices have several applications in the field of either current or voltage protection, e.g. in telephone lines.

The need is felt for devices which can be arranged on the line between the two leads so as to suppress transient phenomena, such as the secondary effects of lightning, by operating as open circuits in a normal condition and shorting the two lines together in the presence of a transient phenomenon ("normalized" lightning) to be suppressed.

Suitable devices to provide this function are, for example, SCR switches formed with four layers of alternate conductivity types, as the one shown for instance in FIGS. 1 to 3. Such a device (well known per se) comprises two terminal connections, an anode A, cathode K, and a control electrode or gate G, and has three junctions $J_1, J_2, J_3$ which govern the device behaviour. In particular, by negatively biasing the cathode with respect to the anode, the junctions $J_1$ and $J_3$ become forward biased while junction $J_2$ is inversely biased; consequently, there is no current flow between the anode and cathode, and the device will be in its off state.

On application of a signal to the control electrode G, the NPN transistor formed by the three layers closest to the cathode begins to conduct, thus lowering its collector voltage level which corresponds, as shown, to the base of the second PNP transistor formed by the three layers closest to the anode A. As a result, the second PNP transistor senses that occurrence as a base drive and begins to conduct, thus producing a regenerative effect. By this time, the device will be in its fully conductive state as represented by the vertical line in the graph of FIG. 3 which also illustrates the relationship existing between current and voltage versus the control current to the electrode G. As is known, (refer, for instance, to Gentry et al., "Semiconductor Controlled Rectifiers: Principles and Application of p-n-p-n Devices", Prentice-Hall, E-E Series) in order for the device to turn on the following condition must be met: $\beta_{NPN} \times \beta_{PNP} = 1$. As the current $I_A$ flowing through the device decreases, the device remains on in accordance with the law illustrated in FIG. 3, until the current reaches a minimum value called holding current, $I_H$.

However, that prior device has the disadvantage of becoming conductive as the voltage across it varies rapidly even with the control current to the electrode G below the desired value for conduction to begin. This phenomenon, which is due to the appearance of capacitance at the junctions, has been obviated by the device, also well known, shown in FIGS. 4 and 5. The technique adopted (refer, for example, to R. W. Aldrich and N. Holonyar Jr. in the article entitled "Two-terminal Asymmetrical and Symmetrical Silicon Negative Resistance Switches", Journal of Applied Physics, Vol. 30, No. 11, November, 1959) consists in practice in providing a resistance between the base region of the NPN transistor and the emitter thereof, which diverts the current generated within the capacitor owing to a voltage variation. In particular, and as shown in FIG. 4, on a silicon chip comprising four layers with different conductivity types, namely a layer 1 of the P++ type, layer 2 of the N type, layer 3 of the P+ type, and layer 4 having several regions of the N+ type, a metal layer 5 has been deposited which part overlaps the layers 3 and 4. The circuit equivalent of such a device is shown in FIG. 5. In that view, one can see the transistor 7 of the PNP type formed by the layers 1, 2, and 3 of FIG. 4, the transistor 8 formed by the layers 2, 3 and 4 of the same, the capacitor 10 formed between the layers 2 and 3 of FIG. 4 (and corresponding to the junction $J_2$), and the resistor 9 placed between the emitter and base of the transistor 8 and due to layer 5. In particular, the resistance of element 9 determines the value of the triggering current of the gate electrode $G_1$. That resistance, which is selected at a very low value to avoid the capacitive current from the capacitor 10 causing the device to turn on prematurely, also causes the control current from the gate electrode $G_1$ to only turn on the device when relatively high. In particular, by selecting the value of 1Ω for R, the triggering current of the gate electrode is fixed at 600–700 mA for the device to turn on.

SUMMARY OF THE INVENTION

In the light of the above-outlined situation, the task of this invention is to provide a controlled electronic switching device for the suppression of transients, which can be turned on at lower triggering current values than the values attainable heretofore, while keeping unaltered the device characteristics as relates to its behaviour as voltage variation and triggering rate.

The controlled electronic switching device according to the present invention should be of simple design, should require no special manufacturing techniques, and should afford comparable cost levels to similar prior devices.

This task is achieved by a controlled electronic switching device for the suppression of transients, comprising a main controlled solid state static switch including several semiconductor layers having two conductivity types alternating with one another and forming junctions, said main switch being provided with a resistive connection between two adjacent layers of different conductivity type, characterized in that it comprises at least a second, auxiliary controlled solid state static switch including several semiconductor layers having two conductivity types alternating with one another and forming junctions, said auxiliary switch being provided with a resistive connection between two adjacent layers of different conductivity type, being connected in parallel with said main switch and having the area of at least one of said junctions thereof smaller than the area of a corresponding junction in said main switch, the resistive connection of said auxiliary switch having a higher resistance than the resistive connection of said main switch, thereby said device can be turned on at low control currents.

In practice, the main switch is associated with a parallel connected auxiliary switch which, having smaller junction areas, has a lower capacitance value, and hence, for a given voltage variation, a lower capacitive current, thus enabling the use of a higher resistance between the base and emitter electrodes of a transistor in the auxiliary switch, and consequently ensuring that the device be turned on at lower values of the gate electrode current.

BRIEF DESCRIPTION OF THE DRAWINGS

Further features and advantages will be more readily understood from the following detailed description of a preferred, though not exclusive, embodiment of this invention, with reference to the accompanying illustrative, but not limitative, drawings, where:

FIG. 1 depicts the theoretical physical structure of a conventional SCR switch;

FIG. 2 shows the graphic symbol for the device of FIG. 1;

FIG. 3 shows a graph illustrating the ratios between the electric quantities of the device of FIG. 1;

FIG. 4 illustrates the physical structure of another conventional device according to the "shorted emitter" technique;

FIG. 5 shows the wiring diagram of the conventional device of FIG. 4;

FIG. 6 shows the wiring diagram of the device of this invention; and

FIG. 7 shows the physical structure of the device of this invention.

DESCRIPTION OF THE PREFERRED EMBODIMENTS

The device according to this invention will be now described with reference to just FIGS. 6 and 7; FIGS. 1-5 relating to conventional devices already reviewed detailedly hereinabove.

The device of this invention comprises a main switch formed by a PNP transistor 20, NPN transistor 21, junction capacitor 26, and resistor 24, and an auxiliary switch including the PNP transistor 22, NPN transistor 23, junction capacitor 27, and resistor 25. Said two switches are practically connected in parallel, and more precisely, it may be seen that the bases of the two transistors 20 and 22 are connected together and to the collectors of the transistors 21 and 23, while the emitters of the transistors 20 and 22 are connected together and to the terminal of the anode A, and the emitters of the transistors 21 and 23 are connected together, to one terminal of the resistors 24 and 25 and to the cathode K. Further, connected to the base of the transistor 23 is a gate electrode $G_1$, and a further gate electrode $G_2$ is connected to the bases of the transistors 20 and 22; the gate electrodes $G_1$ or $G_2$ being alternatively connected to either the positive line lead or negative line lead. Details on the device structure are shown in FIG. 7, where a first layer 30 with conductivity of the P++ type and a second layer 31 with conductivity of the N type may be seen; the layers 30 and 31 are shared by both switches. Formed within the layer 31 are regions 32 and 33 with conductivity of the P+ type, region 32 forming the collector of the transistor 20 and base of the transistor 21 and region 33 forming collector of the transistor 22 and base of the transistor 23. As shown in said view, the junction region between the layer 33 and layer 31 has a smaller area than the junction between the layer 32 and layer 31. Consequently, the capacitance existing between the layer 33 and layer 31 is smaller (by a proportional amount to the ratio between the areas) than the capacitance existing between the layers 32 and 31. Formed in the layers 32 and 33 are then regions 34 and 35 with conductivity of the N+ type; in particular, formed in the layer 32 are the emitter regions 34 of the transistor 21, while in the layer 33, there are formed the emitter regions 35 of the transistor 23. Partly overlapping the layers 32 and 34, respectively 33 and 35, are metal layers 36 and 37 defining the resistors 24 and 25. Finally, a metal layer 38 is provided which interconnects the metal layer 37 with the metal layer 36. The device further comprises the electrodes A and K, forming the device anode and cathode terminals, and the gate electrodes $G_1$ and $G_2$ which govern the conductive state of the device. Either of said gate electrodes is connected to a desired line lead, or possibly to the load itself. The oxide layer 39 acts as an insulator.

The operation of the inventive device is apparent from the foregoing description. In particular, it should be pointed out that, owing to the junction between the layers 31 and 33 having a smaller area than the junction between the layers 32 and 31, its equivalent capacitance $C'$ will be less, and accordingly, also lower will be the current generated as a result of voltage variations across the device. Thus, the current flowing through the equivalent resistance $R'$, 25, will be a lower one, and since the resistance $R'$ is be designed with a higher ohmic value than R, according to any known technique the behaviour of the device due to voltage variations across it is maintained unchanged. Increase of resistance $R'$ allows turning-on of the device with a triggering current from the electrodes $G_1, G_2$ lower than the lowest value attainable heretofore with conventional devices. As evident to those skilled in the art, triggering of the auxiliary device results then in the whole device being triggered. Thus, the device can also operate at much lower currents than in the past while retaining its characteristics unaltered as regards voltage variations and triggering rate. At exhaustion of the transient phenomenon which has turned the device on, and in particular shorted the two leads whereto the anode and cathode terminals are connected, the device is automatically turned off according to a similar pattern to that shown in FIG. 3, thus again separating the two leads.

The invention as disclosed hereinabove is susceptible to many modifications and changes. In particular, while it has been described with specific reference to its application on telephone lines for the suppression of normalized lightning, it could find application wherever a load is to be protected against overvoltage and overcurrent, wherein through the use of external circuit components, programmability of the values of the occurring electric signals can be achieved. Furthermore, while the drawing shows a device comprising a main switch and auxiliary switch, such auxiliary switches may also be provided in a larger number, and, according to a preferred embodiment, such auxiliary devices would be located outside the main device, all around it, to ensure turning on from any sides.

We claim:

1. A controlled electronic switching device for the suppression of transients, having a first device main surface and a second device main surface separated by a plurality of semiconductor layers of alternating conductivity type, said plurality of semiconductor layers including a first layer facing said first device main surface, a second layer facing said first layer, a third layer partially embedded in said second layer, forming a first junction therewith having an area, and facing said second device main surface, at least one main cathode zone partially embedded in said third layer and facing said second device main surface, at least one fourth layer partially embedded in said second layer, forming a second junction therewith having an area smaller than said first area, and facing said second device main surface, said at least one fourth layer extending adjacent to said third layer, said second layer having a portion brought up said second device main surface, thereby, physically separating said third layer from said at least one fourth layer, at least one auxiliary cathode zone partially embedded in said at least one fourth layer and facing said second device main surface, said first, second, third layers and said at least one main cathode zone forming a main switch and said first, second, fourth layers and said at least one auxiliary cathode zone forming an auxiliary switch, a resistive layer of a first ohmic value extending in parallel between said third layer and said at least one main cathode zone and a second resistive layer of a second ohmic value higher than said first ohmic value extending in parallel between said at least one fourth layer and said at least one auxiliary cathode zone, and being electrically connected to said first resistive layer, thereby said auxiliary switch turning on at low control currents and switching on said main switch and remaining turned off for quick voltage variations.

2. A device according to claim 1, wherein said resistive layers comprise metal layers extending on said second device main surface.

* * * * *